United States Patent [19]

Jaffee

[11] Patent Number: 5,761,615
[45] Date of Patent: Jun. 2, 1998

[54] WIDE BAND ZERO IF QUADRATURE DEMODULATOR USING A INTERMEDIATE FREQUENCY AND A SINGLE LOCAL OSCILLATOR

[75] Inventor: James I. Jaffee, Lake Clarke Shores, Fla.

[73] Assignee: Motorola, Inc., Schaumburg, Ill.

[21] Appl. No.: 456,985

[22] Filed: May 31, 1995

[51] Int. Cl.$^6$ .................................................. H04B 1/26
[52] U.S. Cl. .......................... 455/314; 455/324; 455/337; 455/304; 375/332; 329/306
[58] Field of Search ........................ 455/314, 313, 455/323, 326, 334, 337, 338, 76, 183.1, 86, 303, 304, 305, 296, 324, 216, 207; 329/308, 306, 316; 375/329, 331, 332, 376, 327

[56] References Cited

U.S. PATENT DOCUMENTS

| | | | |
|---|---|---|---|
| 3,390,343 | 6/1968 | Carter | 455/203 |
| 4,492,960 | 1/1985 | Hislop | 455/323 |
| 4,776,039 | 10/1988 | Akaiwa . | |
| 5,111,162 | 5/1992 | Hietala et al. | 455/76 |
| 5,210,484 | 5/1993 | Remillard et al. | 455/314 |
| 5,303,417 | 4/1994 | Laws | 455/314 |
| 5,410,277 | 4/1995 | Asao et al. | 331/10 |
| 5,412,351 | 5/1995 | Nystrom et al. | 375/329 |
| 5,448,110 | 9/1995 | Tuttle et al. | 340/825.54 |
| 5,465,415 | 11/1995 | Bien | 455/326 |
| 5,479,458 | 12/1995 | Tanaka | 375/376 |

FOREIGN PATENT DOCUMENTS

| | | | |
|---|---|---|---|
| 0204317 | 11/1984 | Japan | 455/304 |
| 0453302 | 2/1992 | Japan | 455/314 |

OTHER PUBLICATIONS

Shrader, R., Electronic Communication, 6th Ed. 1993, pp. 210–211 and 221–222.

ICs simplify design of single–sideband receivers; Robert J. Zavrel, Signetics Corp. EDN Apr. 3, 1986.

*Primary Examiner*—Reinhard J. Eisenzopf
*Assistant Examiner*—Doris To
*Attorney, Agent, or Firm*—Gregg Rasor

[57] ABSTRACT

A low power zero-IF selective call receiver has a local oscillator (106) that generates an injection signal for a first mixer (104) and a pair of quadrature phase related injection signals (122, 124) for a pair of second mixers (112, 114). The first mixer converts the received carrier signal (102) to an intermediate signal (108). A digital phase shifter/divider (116) coupled to the local oscillator (106) generates the pair of quadrature phase related injection signals (122, 124) at the frequency of the intermediate signal (108) which also equals the frequency of the local oscillator (106) divided by an integer greater then 1. The pair of second mixers (112, 114) coupled to the digital phase shifter/divider (116) converts the in and quadrature phase components (122, 124) of the intermediate signal (108) to respective in and quadrature phase baseband signals (126, 128).

29 Claims, 5 Drawing Sheets

5,761,615

WIDE BAND ZERO IF QUADRATURE DEMODULATOR USING A INTERMEDIATE FREQUENCY AND A SINGLE LOCAL OSCILLATOR

FIELD OF THE INVENTION

This invention relates generally to direct conversion receivers, and more specifically to low power direct conversion paging receivers.

BACKGROUND OF THE INVENTION

In portable battery operated products such as a selective call receiver, direct conversion receivers, having few stages, offer many advantages when used in low power personal paging receivers. The reduction in the number of stages contributes to long battery life and a small physical package. Although these advantages are important, the difficulty evolved in the design of direct conversion receiver and the reduced performance of a direct conversion receiver when compared with other receivers such as the super heterodyne receivers sometimes outweigh the advantages.

Direct conversion receivers require the generation of a local oscillator on a frequency equal to the desired receiver carrier frequency. This relatively strong local oscillator signal must be well isolated from the antenna and the input of the receiver. Otherwise, leakage of the local oscillator signal into the receiver's signal frequency path may cause overload of sensitive stages in the receiver and to the generation of a strong D.C. component in the output of a detector. This condition results in poor sensitivity and degraded spurious signal rejection. The presence of a D.C. component must also be rejected in the baseband amplifier, further complicating the design of the baseband amplifiers. The degree of isolation needed for proper RF operation is difficult to obtain in large non-portable receivers, and even more difficult obtain in a very small personal receiver.

The quadrature detectors generally used in direct conversion receivers require a local oscillator to have two outputs comprising an in phase and a quadrature phase output signal. To achieve good spurious signal rejection, the quadrature phase and amplitude relationships of the two signals must be very accurately matched. Prior art methods of obtaining the accuracy required of these quadrature signals are not compatible with the modern objectives of a low part count and low power consumption design needed for price and specification competitive personal battery powered equipment.

Conventionally, a quadrature relationship for injection signals was obtained using a passive phase shift network or the like having quadrature outputs. This analog phase shifter generally maintains quadrature over a quite limited bandwidth. Greater bandwidth can be obtained with a greater complexity and increased parts count.

In an attempt to operate over a wider bandwidth, digital phase shifters were designed. However, these digital phase shifters required the local oscillator to operate at some integer multiple of the required injection frequency, generally four times. Consequently, the local oscillator of a low power 930 MHz paging receiver would yield a system operating at 3720 MHz, which would greatly increase the power required by the oscillator and the digital phase shifter.

Accordingly, what is needed is a low power, direct conversion receiver that realizes the advantages of a digitally synthesized zero-IF receiver without incurring the cost and power consumption penalties associated with the use of prior art high frequency oscillators or additional heterodyne stages to achieve frequency conversion.

SUMMARY OF THE INVENTION

Briefly, according to the invention, there is provided a low power zero-IF selective call receiver that solves several of the problems associated with a direct conversion receiver, while maintaining the advantages of utilizing the least number of conversion stages, resulting in low power consumption and efficient operation. A first mixer and a local oscillator operate to convert the received carrier signal to an intermediate signal. The same local oscillator is also used by a digital phase shifter/divider to derive two quadrature signals that are used by a pair of second mixers to demodulate the intermediate signal into two quadrature baseband signals.

DESCRIPTION OF A PREFERRED EMBODIMENT

Figure 1:
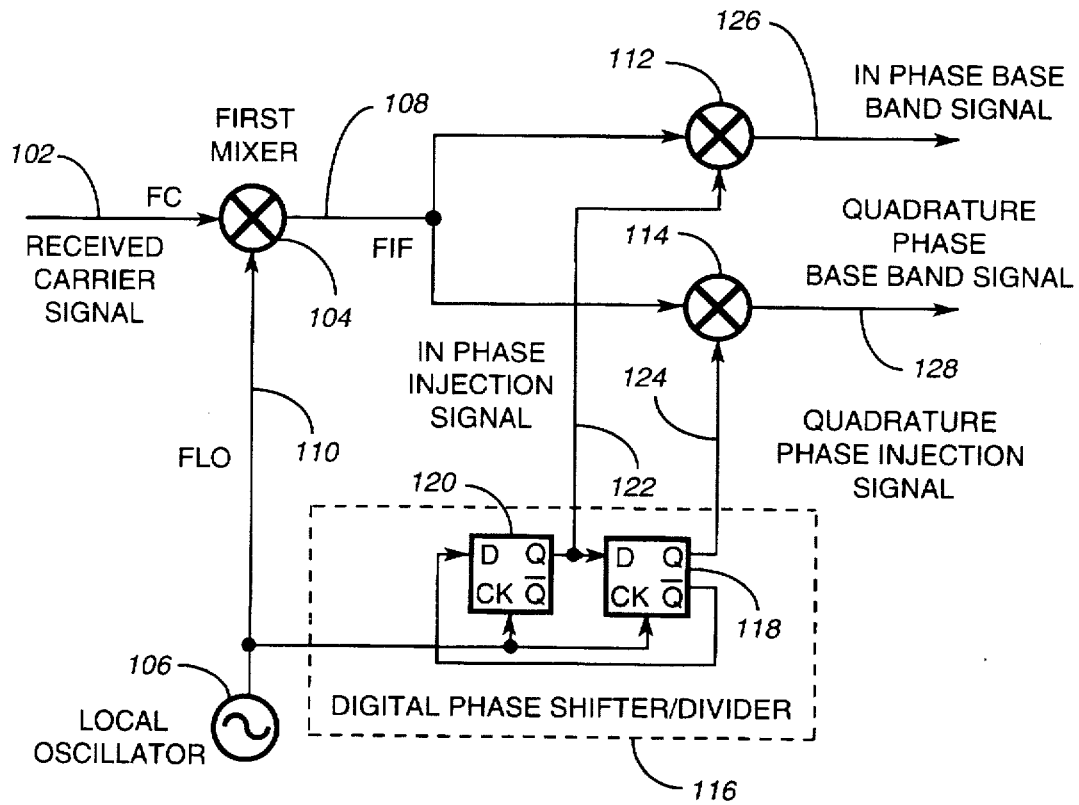
FIG. 1 is a detailed block diagram, showing the first mixer, the single local oscillator, the wideband phase shifter/divider, and the second and the third mixer, configured in accordance with the invention.

This invention overcomes many of the disadvantages associated with a direct conversion receiver. Referring to FIG. 1, the invention overcomes these disadvantages by incorporating a first mixer 104 that converts a received carrier signal 102 to an intermediate signal 108, without incurring the cost and power consumption penalty of adding a second crystal oscillator. The invention accomplishes this by designing the receiver in such a way that the frequency of the received carrier signal 102 ($f_c$) the frequency of a local oscillator 106, ($f_{LO}$), the frequency of the intermediate signal 108, ($f_{IF}$), and the frequency of an in phase injection signal 122 and a quadrature phase injection signal 124, has a specific relationship. Operating the receiver with this specific relationship of frequencies eliminates the operation of a local oscillator on the receiver's carrier frequency and the resulting degradation of performance caused by the direct couple of this high level signal into the sensitive stages of the receiver. Operating the receiver in this manor also lowers the operating frequency of the local oscillator 106, ($f_{LO}$), and a digital phase shifter/divider 116, reducing power consumption and reducing the specification for the components used in these circuits.

Figure 2:
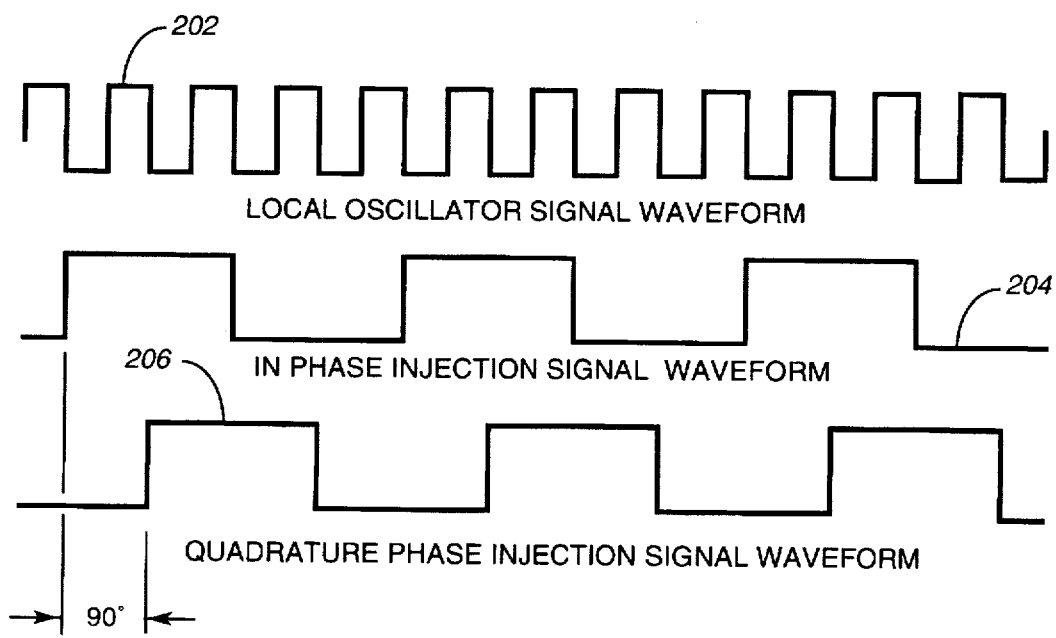
FIG. 2 is a timing diagram showing the relationship of the signals in the digital phase shifter/divider.

The specific relationship can be shown by referring to FIG. 1. The received carrier signal 102 and a local oscillator signal 110 from the local oscillator 106 is coupled to the first mixer 104. The first mixer 104 produces the intermediate signal 108 having a frequency $f_{IF}$. Where $f_{IF}=f_C-f_{LO}$. It can be appreciated that a similar relationship can also be developed when $f_{IF}=f_{LO}-f_C$ or $f_{IF}=f_C+f_{LO}$. The intermediate signal 108 is coupled to a second mixer 112 and a third mixer 114 (a pair of mixers). The local oscillator signal 110 is also coupled to the digital phase shifter/divider 116. The digital phase shifter/divider 116 comprises a first D type latch 120 and a second D type latch 118 configured as a Johnson counter. The signals associated with the Johnson counter are shown in FIG. 2. The local oscillator signal 110, is shown in FIG. 2 as a square wave for convenience as local oscillator signal waveform 202. The operation of the Johnson counter is well known to those familiar with the art of digital circuit design. By inspection, it is apparent that the in phase injection signal 122, represented as an in phase injection signal waveform 204 and the quadrature phase injection signal 124 represented as a quadrature phase injection signal waveform 206 (a pair of quadrature related injection signals), have a quadrature phase relationship. It is further apparent that the frequency of the in phase injection signal 122 and the frequency of the quadrature phase injection signal 124, ($f_{INJ}$) are equal to $f_{LO}/N$. For illustration purposes, the Johnson counter shown in FIG. 1 has N=4. The in phase injection signal 122 is coupled to the second mixer 112 and the quadrature phase injection signal 124 is coupled to the third mixer 114. The second mixer 112 and the third mixer 114 produce a plurality of signals. The signals of interest are an in phase baseband signal 126 and a quadrature phase baseband signal 128 produced by the second mixer 112 and the third mixer respectively, and being converted quadrature components of the information modulated on the received carrier signal 102. For the proper operation of the second mixer 112 and the third mixer 114, $F_{INJ}$ must be essentially equal to $f_{IF}$. It then follows that if $f_{INJ}=f_{IF}$, and $f_{INJ}=f_{LO}/N$, and $f_{IF}=f_C-f_{LO}$, then the specific relationship of the frequencies can be shown to be $f_c=f_{LO}[(N+1)/N]$, and $f_{IF}=f_{LO}/N$.

The intermediate signal 108 is not fixed, as in a conventional receiver with a mixer and a fixed intermediate frequency amplifier, but changes as the received carrier signal 102 changes. The frequency of the intermediate signal 108 changing in this manner is called a walking intermediate frequency signal.

Figure 3:
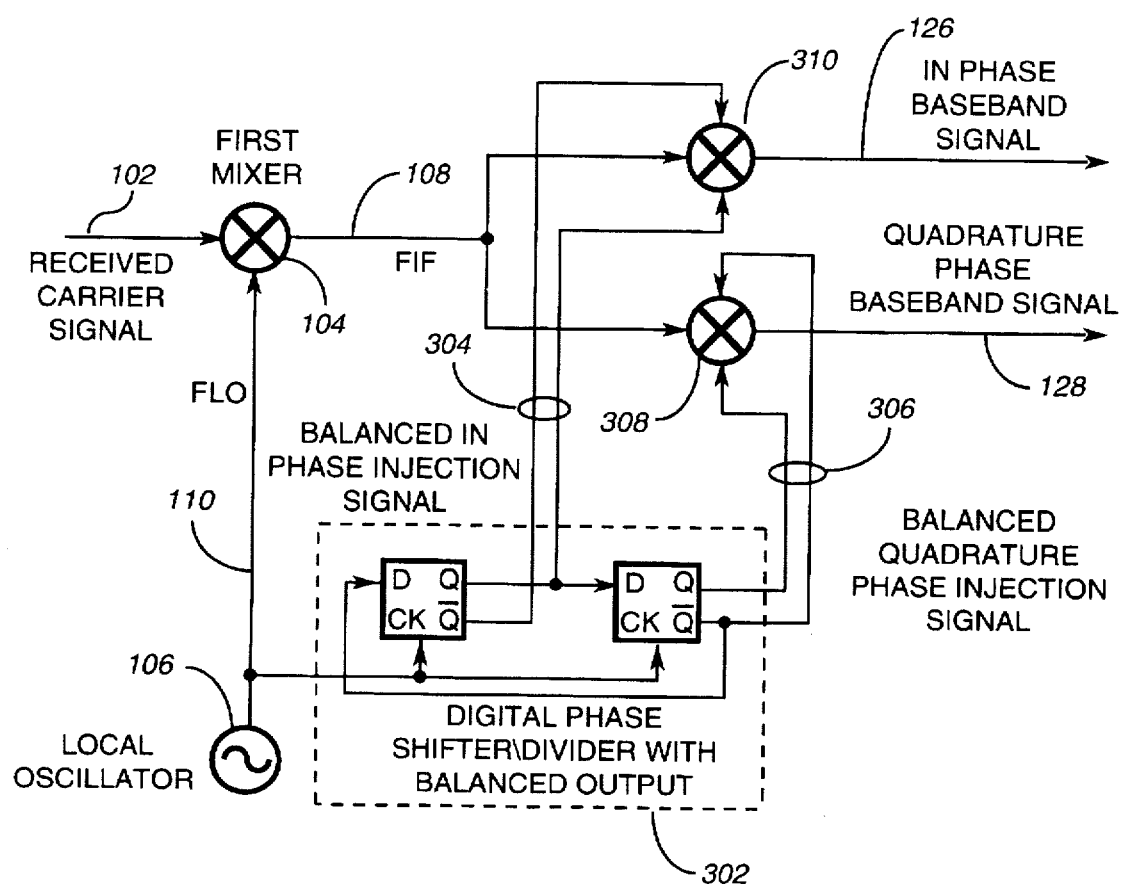
FIG. 3 is a detailed block diagram showing the replacement of some of the unbalanced elements and signal lines with balanced element and balanced signal lines.

FIG. 3 shows the circuit of FIG. 1 that is an enhancement to reduce radiation and undesirable coupling of the in phase injection signal 122 and the quadrature phase injection signal 124, where in the digital phase shifter/divider 116 has been replaced with a digital phase shifter/divider having balanced outputs 302, the conductor carrying the in phase injection signal 122 is replaced with balanced conductors, carrying a balanced in phase injection signals 304, the conductor carrying the quadrature phase injection signal 124 is replaced with balanced conductors, carrying a balanced quadrature phase injection signals 306, the second mixer 112 is replaced with a second mixer having balanced inputs 310, and the third mixer 114 is replaced with a third mixer having balanced inputs 308.

Figure 4:
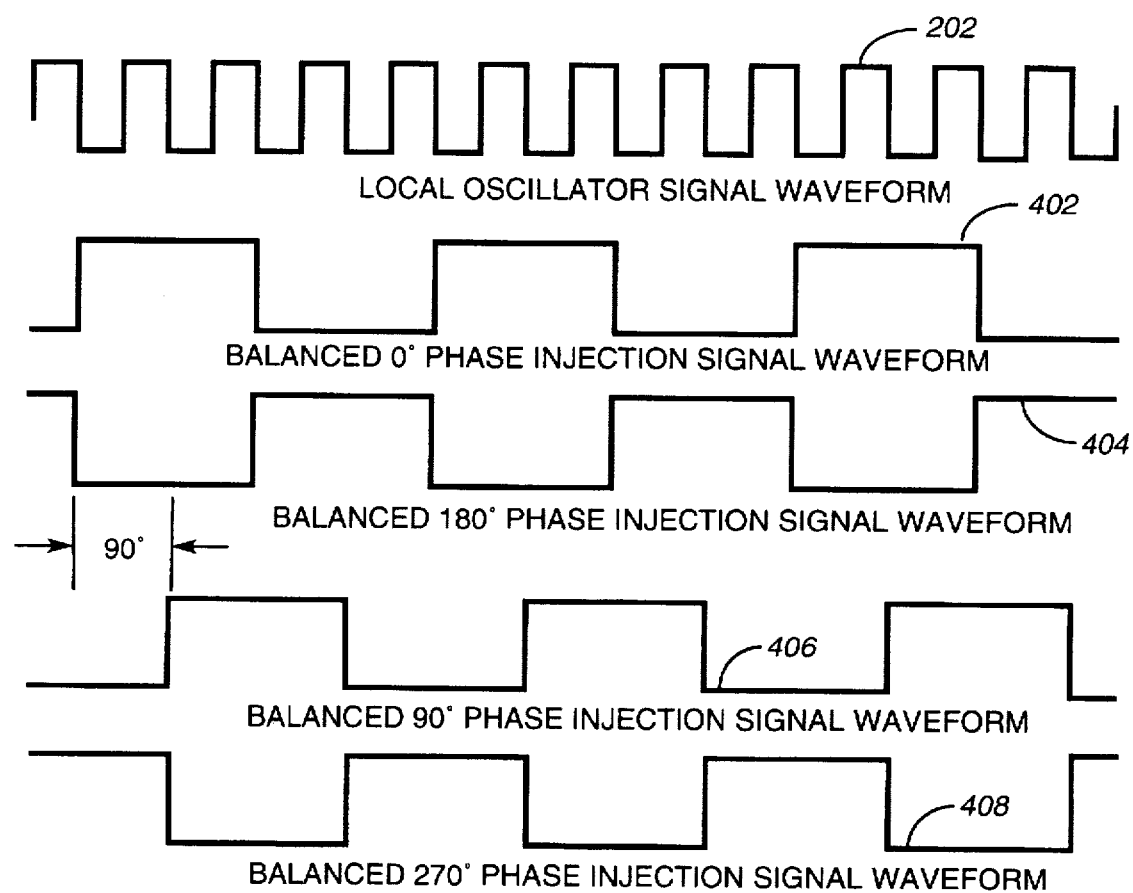
FIG. 4 is a timing diagram showing the relationship of the balanced signals in the digital phase shifter/divider.

FIG. 4 shows the signal waveforms that are present in the enhanced circuit. The balanced in phase injection signal 304 is now represented by a pair of waveforms, a balanced 0° phase injection signal waveform 402 and a balanced 180° phase injection signal waveform 404, and the balanced quadrature phase injection signal 308 is now represented by a pair of waveforms, a balanced 90° phase injection signal waveform 406 and a balanced 270° phase injection signal waveform 408. Notice how the two waveforms in each pair complement each other. Each pairs of signals are routed together such that any electromagnetic field from one conductor that causes undesirable coupling to another circuit is canceled by the electromagnetic field from the other conductor.

The first mixer 104, the second mixer 112, the third mixer 114, the second mixer having balanced inputs 310 and the third mixer having balanced inputs 308 could comprise, but not limited to one of the following: a non-linear semiconductor mixer, a switching mixer, or a Gilbert cell.

Figure 5:
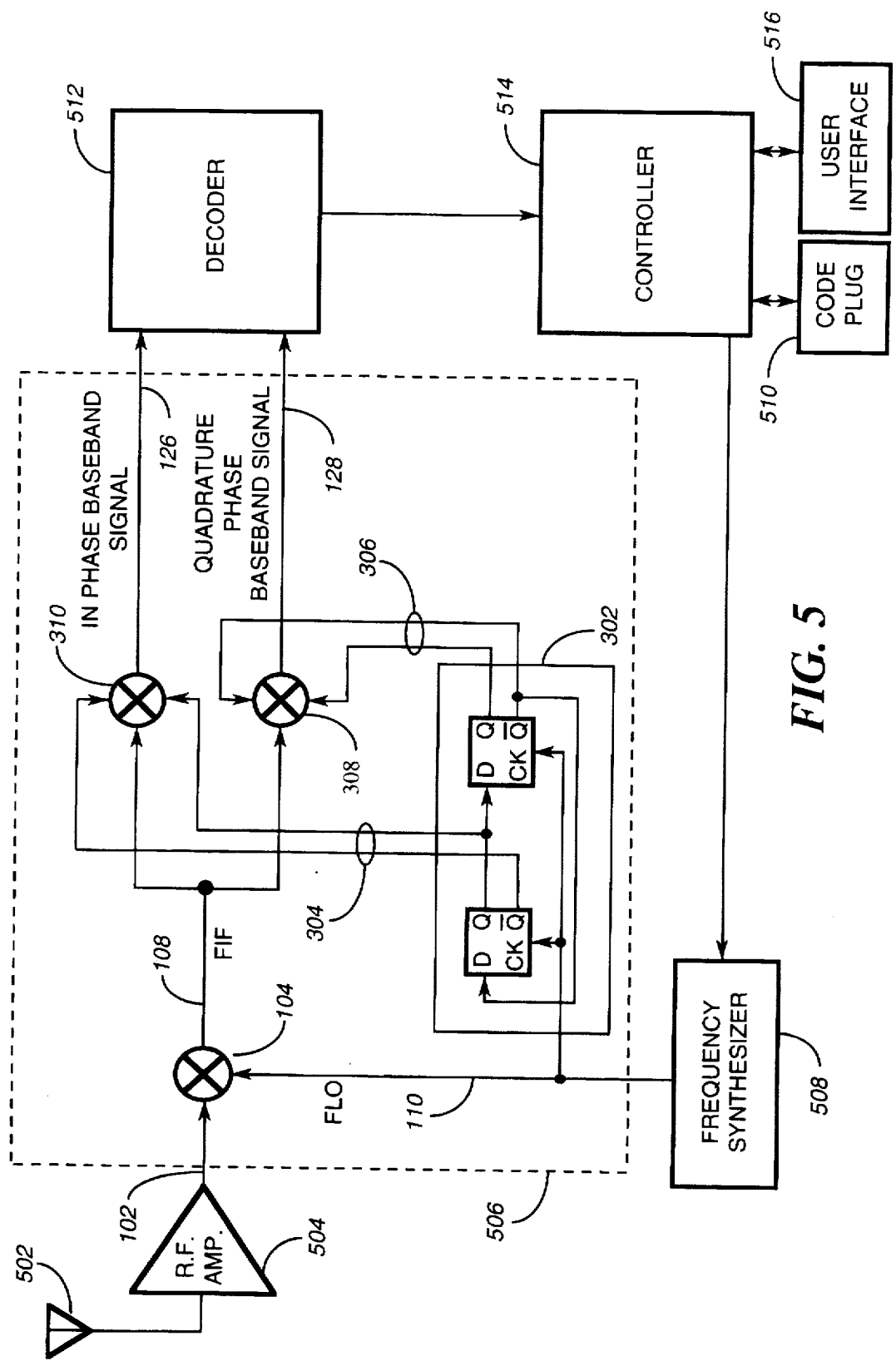
FIG. 5 is a selective call receiver incorporating the elements of FIG. 3.

The local oscillator 106 can be a quartz crystal controlled oscillator or a frequency synthesizer 508 as shown in FIG. 5, utilizing digital logic and phase lock loop technology. It can be appreciated that there are many frequency generation techniques that are suitable for this application, such as a discrete crystal controlled single frequency oscillator, frequency synthesized crystal controlled oscillator 508, or a frequency synthesized resonator controlled oscillator.

The digital phase shifter/divider 116 and the digital phase shifter/divider with balanced outputs 302 could comprise but not limited to one of the following: complementary metal oxide semiconductor logic or emitter coupled logic. Moreover, in the preferred embodiment, all circuitry is designed with no more than a single diode drop between the positive and negative potentials, thus yielding circuits that are fully functional at one volt D.C. or less.

A selective call paging receiver is shown in FIG. 5 that incorporates a wideband phase shifter/divider demodulator 506 of FIG. 3. The local oscillator 106 has been replaced with a frequency synthesizer 506 providing the local oscillator signal 110. In this embodiment a carrier wave is intercepted by an antenna 502 and coupled to RF amplifier 504. The output of the RF amplifier 504 provides the received carrier signal 102 for the wide band phase shifter/ divider demodulator 506. The in phase base band signal 126 and a quadrature phase base band signal 128 from the wide band phase shifter/divider demodulator 506 is coupled to a decoder 512. The decoder 512 provides the signal processing appropriate for the type of signal and modulation used. In the case of a POCSAG protocol the signal is a digital two state frequency shift key signal. It can be appreciated that by using appropriate signal processing many different types of modulations and signal can be processed. The decoder 512 is coupled to a controller 514. The controller 514 is coupled to the frequency synthesizer 508, a code plug 510 and an user interface 516. The controller 514 provides the basic control of the various functions of the selective call paging receiver and generally consist of a microprocessor, memory and necessary input output devices. The code plug 510 stores the unique identification information necessary for the controller to implement the selective call feature. The user interface 516 provides the user with an audio, visual or mechanical signal indicating the reception of information and may also include a display and push buttons for the user to inter commands to control the receiver.

In an alternate embodiment of this invention the local oscillator 106, the first mixer 104, the second mixer having balanced inputs 310 and the third mixer having balanced inputs 308 and the digital phase shifter/divider with balanced outputs 302 would be integrated into a single integrated circuit. This integrated circuit could be further enhanced by incorporating the frequency synthesizer 508 shown in FIG. 5.

Figure 6:
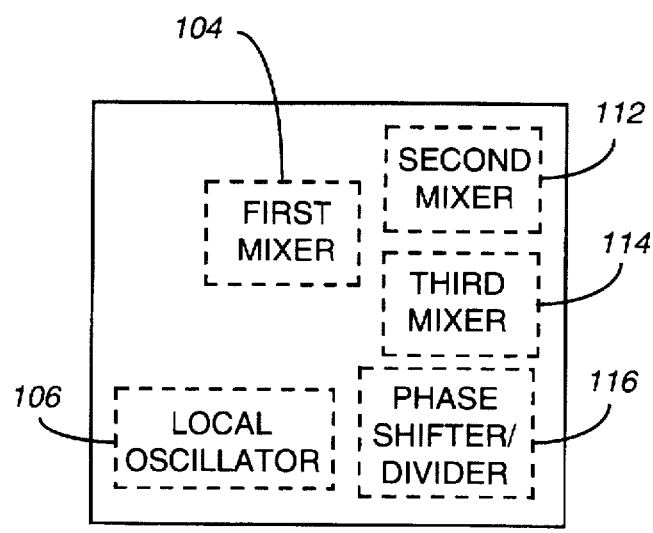
FIG. 6 shows an exemplary implementation of the circuit components shown in FIG. 1, FIG. 3, and FIG. 5 comprising the first mixer, the local oscillator, the wideband phase shifter/divider, and the second and the third mixer, in a single integrated circuit.

FIG. 6 shows an exemplary implementation of the circuit components shown in FIG. 1, FIG. 3, and FIG. 5 comprising the first mixer, the local oscillator, the wideband phase shifter/divider, and the second and the third mixer, in a single integrated circuit.

I claim:

1. A low power zero-IF selective call receiver, comprising:

a local oscillator that generates an injection signal at a first frequency ($f_{LO}$);

a first mixer coupled to the local oscillator for converting a received carrier signal of a second frequency ($f_C$) to an intermediate signal of a third frequency ($f_{IF}$) in response to the injection signal at the first frequency ($f_{LO}$), where the third frequency ($f_{IF}$) associated with the intermediate signal is one of a sum or a difference of the first ($f_{LO}$) and second ($f_C$) frequencies;

a digital phase shifter/divider coupled to the local oscillator and to the first mixer, the digital phase shifter/divider generating a pair of quadrature phase related injection signals at the third frequency ($f_{IF}$) which is the first frequency ($f_{LO}$) divided by an integer greater than 1;

a pair of second mixers coupled to the digital phase shifter/divider and the first mixer, the pair of second mixers converting an in phase component of the intermediate signal to an in phase baseband signal and a quadrature component of the intermediate signal to a quadrature baseband signal in response to an in phase and quadrature component of the pair of quadrature phase related injection signals, respectively.

2. The low power zero-IF selective call receiver according to claim 1 wherein the local oscillator comprises a discrete crystal controlled single frequency oscillator.

3. The low power zero-IF selective call receiver according to claim 1 wherein the local oscillator comprises a frequency synthesized crystal controlled oscillator.

4. The low power zero-IF selective call receiver according to claim 1 wherein the local oscillator comprises a frequency synthesized resonator controlled oscillator.

5. The low power zero-IF selective call receiver according to claim 1 wherein the first mixer comprises a non-linear semiconductor mixer.

6. The low power zero-IF selective call receiver according to claim 1 wherein the first mixer comprises a switching mixer.

7. The low power zero-IF selective call receiver according to claim 1 wherein the digital phase shifter/divider comprises a Johnson counter.

8. The low power zero-IF selective call receiver according to claim 1 wherein the second mixers comprise non-linear semiconductor mixers.

9. The low power zero-IF selective call receiver according to claim 1 wherein the second mixers comprise switching mixers.

10. The low power zero-IF selective call receiver according to claim 1 wherein the local oscillator, first mixer, digital phase shifter/divider, and pair of second mixers are fabricated as a single integrated circuit.

11. The low power zero-IF selective call receiver according to claim 1 wherein the third frequency ($f_{IF}$) is the first frequency ($f_{LO}$) divided by 4.

12. A low power zero-IF selective call receiver, comprising:

a local oscillator that generates an injection signal at a first frequency for converting a received carrier signal at a second frequency to an intermediate signal at a third frequency;

a digital phase shifter/divider coupled to the local oscillator, the digital phase shifter/divider generating at the third frequency, an in phase injection signal and a quadrature phase injection signal;

a first mixer coupled to the local oscillator and the digital phase shifter/divider, the first mixer converting the received carrier signal to an intermediate signal at the third frequency in response to the injection signal at the first frequency, the third frequency being one of a sum or a difference of the first and second frequencies and further being equal to the first frequency divided by an integer greater than 1;

a second mixer coupled to the first mixer and the digital phase shifter/divider, the second mixer converting an in phase component of the intermediate signal to an in phase baseband signal in response to the in phase injection signal; and a third mixer coupled to the first mixer and the digital phase shifter/divider, the third mixer converting a quadrature component of the intermediate signal to a quadrature baseband signal in response to the quadrature phase injection signal.

13. The low power zero-IF selective call receiver according to claim 12 wherein the local oscillator comprises a discrete crystal controlled single frequency oscillator.

14. The low power zero-IF selective call receiver according to claim 12 wherein the local oscillator comprises a frequency synthesized crystal controlled oscillator.

15. The low power zero-IF selective call receiver according to claim 12 wherein the local oscillator comprises a frequency synthesized resonator controlled oscillator.

16. The low power zero-IF selective call receiver according to claim 12 wherein the first mixer comprises a non-linear semiconductor mixer.

17. The low power zero-IF selective call receiver according to claim 12 wherein the first mixer comprises a switching mixer.

18. The low power zero-IF selective call receiver according to claim 12 wherein the digital phase shifter/divider comprises a Johnson counter.

19. The low power zero-IF selective call receiver according to claim 12 wherein the second mixer comprises a non-linear semiconductor mixer.

20. The low power zero-IF selective call receiver according to claim 12 wherein the second mixer comprises a switching mixer.

21. The low power zero-IF selective call receiver according to claim 12 wherein the third mixer comprises a non-linear semiconductor mixer.

22. The low power zero-IF selective call receiver according to claim 12 wherein the third mixer comprises a switching mixer.

23. The low power zero-IF selective call receiver according to claim 12 wherein the in phase injection signal and the quadrature injection signal are each a pair signals of opposite phase and electrically balanced with respect to ground for the purpose of reducing electromagnetic interference due to unwanted radiation and coupling of said signals.

24. The low power zero-IF selective call receiver according to claim 12 wherein the local oscillator, first mixer, digital phase shifter/divider, second mixer, and third mixer are fabricated as a single integrated circuit.

25. The low power zero-IF selective call receiver according to claim 12 wherein the third frequency is the first frequency divided by 4 and further being equal to one of a sum or a difference of the first and second frequencies.

26. A low power zero-IF selective call receiver, comprising:

a first mixer receiving a carrier signal at a second frequency, and in response to a local oscillator injection signal at a first frequency, producing a walking intermediate frequency signal at a third frequency;

a direct conversion quadrature demodulator receiving the walking intermediate frequency signal from the first mixer and producing at least two output signals representing the real and imaginary components of modulated information contained in the carrier signal;

a local oscillator operating to provide the first local oscillator injection signal to the first mixer at the first frequency, and a second local oscillator injection signal to the direct conversion quadrature demodulator at the third frequency which is equal to the first frequency divided by an integer N greater than 1 and further equal to one of a sum or a difference of the first and second frequencies.

27. The low power zero-IF selective call receiver according to claim 26, wherein the direct conversion quadrature demodulator comprises:

a second mixer coupled to the first mixer and a digital phase shifter/divider, the second mixer converting an in phase component of the walking intermediate frequency signal to an in phase baseband signal in response to an in phase injection component of the second oscillator signal; and a third mixer coupled to the first mixer and the digital phase shifter/divider, the third mixer converting a quadrature component of the walking intermediate frequency signal to a quadrature baseband signal in response to a quadrature injection component of the second oscillator signal.

28. The low power zero-IF selective call receiver according to claim 26, wherein the direct conversion quadrature demodulator comprises:

a pair of second mixers coupled to a digital phase shifter/divider and the first mixer, the pair of second mixers converting an in phase component of the walking intermediate frequency signal to an in phase baseband signal and a quadrature component of the walking intermediate frequency signal to a quadrature baseband signal in response to an in phase and a quadrature component of the second oscillator signal, respectively.

29. The low power zero-IF selective call receiver according to claim 26 wherein the integer N is equal to 4.

* * * * *